United States Patent
Hui et al.

(10) Patent No.: US 7,015,135 B2
(45) Date of Patent: Mar. 21, 2006

(54) METHOD AND SYSTEM FOR REDUCING CONTACT DEFECTS USING NON CONVENTIONAL CONTACT FORMATION METHOD FOR SEMICONDUCTOR CELLS

(75) Inventors: Angela T. Hui, Fremont, CA (US); Wenmei Li, Sunnyvale, CA (US); Amy C. Tu, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 186 days.

(21) Appl. No.: 10/316,569

(22) Filed: Dec. 10, 2002

(65) Prior Publication Data

US 2004/0110368 A1 Jun. 10, 2004

(51) Int. Cl.
*H01L 21/4763* (2006.01)

(52) U.S. Cl. .................. 438/636; 438/689; 438/740
(58) Field of Classification Search ................ 438/636
See application file for complete search history.

(56) References Cited

U.S. PATENT DOCUMENTS

| | | | |
|---|---|---|---|
| 6,235,640 B1 | 5/2001 | Ebel et al. ............. | 438/706 |
| 6,358,842 B1 | 3/2002 | Zhou et al. ............. | 438/633 |
| 6,372,638 B1 | 4/2002 | Rodriguez et al. ....... | 438/640 |
| 6,376,389 B1 * | 4/2002 | Subramanian et al. .... | 438/740 |
| 6,620,732 B1 * | 9/2003 | Schuegraf .............. | 438/689 |
| 2001/0008226 A1 | 7/2001 | Hung et al. ............ | 216/18 |

* cited by examiner

*Primary Examiner*—David Nelms
*Assistant Examiner*—Thao P Le
(74) *Attorney, Agent, or Firm*—Winstead Sechrest & Minick P.C.

(57) ABSTRACT

A method and system for providing at least one contact in a semiconductor device. The semiconductor device includes a substrate, an etch stop layer, an interlayer dielectric on the etch stop layer, an anti-reflective coating layer on the interlayer dielectric, and at least one feature below the etch stop layer. A resist mask having an aperture and residing on the anti-reflective coating layer is provided. The aperture is above an exposed portion of the anti-reflective coating layer. The method and system include etching the exposed anti-reflective coating layer and the underlying interlayer dielectric without etching through the etch stop layer, thereby providing a portion of at least one contact hole. The method and system also include removing the resist mask in situ, removing a portion of the etch stop layer exposed in the portion of the contact hole, and filling the contact hole with a conductive material.

6 Claims, 5 Drawing Sheets

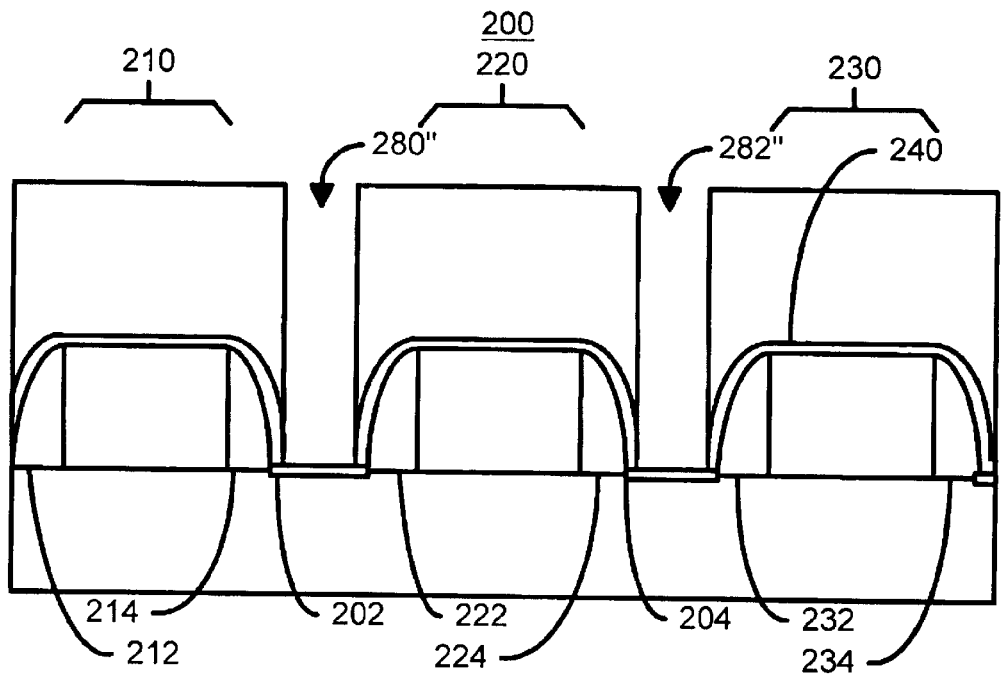
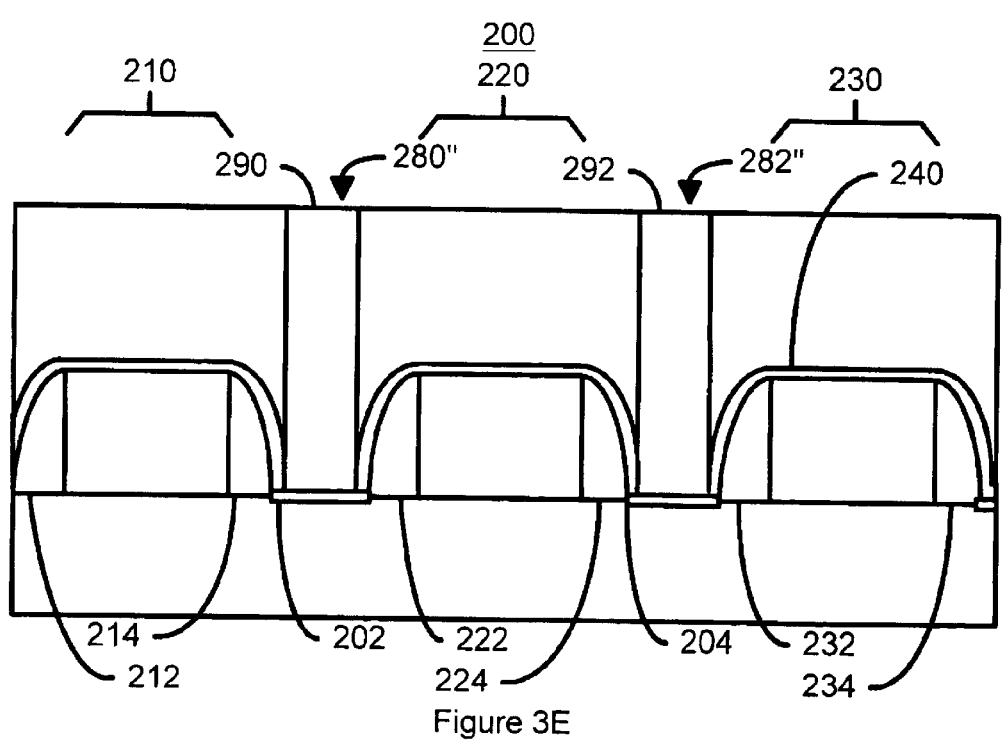

METHOD AND SYSTEM FOR REDUCING CONTACT DEFECTS USING NON CONVENTIONAL CONTACT FORMATION METHOD FOR SEMICONDUCTOR CELLS

FIELD OF THE INVENTION

The present invention relates to semiconductor devices, and more particularly to a method and system for providing a contacts having connection for nonvolatile memory cells using polysilicon.

BACKGROUND OF THE INVENTION

Conventional semiconductor devices, such as conventional nonvolatile memory devices, typically include gate stacks, sources and drains. Generally, a source is positioned at one edge of the gate stack, while the drain is at the opposing end of the gate stack. Field insulating regions generally run perpendicular to the gate stacks and are typically used to electrically isolate different devices. The field insulating regions are typically composed of oxide. The gate stacks, sources and drains are insulated using an interlayer dielectric that is typically composed of HDP, TEOS or BPTEOS. An etch stop layer, typically SiN or SiON, lies below the interlayer dielectric.

In order for the conventional semiconductor device to function, electrical contact is made to portions of the conventional semiconductor device, such as the drains and gate stack. In order to form the contacts, a CoSi layer is formed on the component, such as the drain, to reduce the electrical resistance to the contact. An antireflective coating layer is provided above the interlayer dielectric. The anti-reflective coating layer is typically composed of SiN or SiON. A photoresist mask is provided above the anti-reflective coating layer. The photoresist mask includes apertures above the regions of the interlayer dielectric which are to be etched to form contact holes. Typically, portions of the anti-reflective coating layer, the interlayer dielectric and etch stop layer are removed in a single etch to form contact holes, exposing the underlying CoSi layer. The photoresist mask is then stripped. Typically, the photoresist mask is stripped, typically using an ashing procedure. A wet cleaning is also typically performed to remove remnants of the etch of the interlayer dielectric, such as polymers within the contact hole. A conductive layer, such as a W plug, is deposited to fill the contact holes. The conductive layer can then be polished, typically using a chemical mechanical polish ("CMP") process. Thus a portion of the conductive layer outside of the contact holes is removed and a smooth surface provided.

Although the conventional method for forming contacts in a semiconductor device functions, one of ordinary skill in the art will readily recognize that the conventional method results in defects. For example, the etch of the anti-reflective coating layer, interlayer dielectric and etch stop layer typically leaves a polymer residue within the contact hole. In order to remove this polymer, a wet clean is used to remove the polymers arising from the contact hole formation. Moreover, ashing is typically used to remove the resist. These multiple complicated ashing and wet cleaning processes typically result in defects, such as the presence of particles due to the additional handling of the semiconductor device. In addition, the layer W plug CMP process normally scratches the anti-reflective coating layer on top of dielectric material, thereby forming massive defects in the form of scratches. These scratches make it difficult to distinguish true particle defects from the scratches. Typically a long polishing step is necessary to remove the top anti-reflective coating layer in order to preclude scratch formation.

Accordingly, what is needed is a system and method for providing a semiconductor device having contacts with fewer defects. The present invention addresses such a need.

SUMMARY OF THE INVENTION

The present invention provides a method and system for providing at least one contact in a semiconductor device. The semiconductor device includes a substrate, an etch stop layer, an interlayer dielectric on the etch stop layer, an anti-reflective coating layer on the interlayer dielectric, and at least one feature below the etch stop layer. A resist mask having at least one aperture and residing on the anti-reflective coating layer is provided. The at least one aperture is above an exposed portion of the anti-reflective coating layer. The method and system comprise etching the exposed portion of the anti-reflective coating layer and the interlayer dielectric below the exposed portion of the anti-reflective coating layer without etching through the etch stop layer to provide a portion of at least one contact hole. The method and system also comprise removing the resist mask in situ, removing a portion of the etch stop layer exposed in the portion of the at least one contact hole to provide the at least one contact hole in situ, and filling the at least is one contact hole with a conductive material.

According to the system and method disclosed herein, the present invention performs a portion of the fabrication of the contact holes using an in-situ resist strip to provide a more effective post etch polymer removal, which simplifies the post contact cleaning cycle by eliminating additional ashing and wet cleaning processes and reduces the chance of introducing defect particles.

BRIEF DESCRIPTION OF THE DRAWINGS

FIGS. 3A–3E depict one embodiment of a semiconductor device in accordance with the present invention during fabrication.

DETAILED DESCRIPTION OF THE INVENTION

The present invention relates to an improvement in semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing at least one contact in a semiconductor device. The semiconductor device includes a substrate, an etch stop layer, an interlayer dielectric on the etch stop layer, an anti-reflective coating layer on the interlayer dielectric, and at least one feature below the etch stop layer. A resist mask having at least one aperture and residing on the anti-reflective coating layer is provided. The at least one aperture is above an exposed portion of the anti-reflective coating layer. The method and system comprise etching the exposed portion of the anti-reflective coating layer and the interlayer dielectric below the exposed portion of the anti-reflective coating layer without etching through the etch stop layer to provide a portion of at least one contact hole. The method and system also comprise removing the resist mask in situ, removing a portion of the etch stop layer exposed in the portion of the at least one contact hole to provide the at least one contact hole in situ, and filling the at least one contact hole with a conductive material.

The present invention will be described in terms of methods including particular steps. Furthermore, for clarity, some steps are omitted. One of ordinary skill in the art will, therefore, readily recognize that this method and system will operate effectively for other methods having different and/or additional steps. The present invention is also described in conjunction with a particular semiconductor device having certain components. However, one of ordinary skill in the art will readily recognize that the present invention is consistent with a semiconductor device having other and/or different components.

Figure 1:
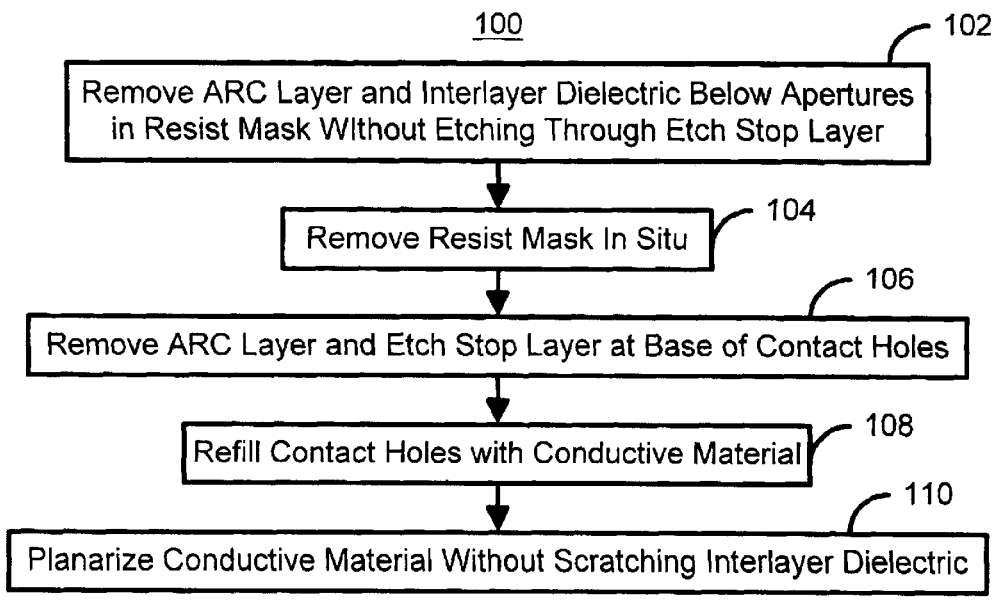
FIG. 1 is a high-level flow chart of one embodiment of a method in accordance with the present invention for providing contacts with reduced defects.

To more particularly illustrate the method and system in accordance with the present to invention, refer now to FIG. 1, depicting one embodiment of a method 100 in accordance with the present invention for providing contacts with reduced defects. The method 100 preferably commences after a mask has been provided on the semiconductor device. The semiconductor device includes an etch stop layer, an interlayer dielectric layer on the etch stop layer and an anti-reflective coating layer on the interlayer dielectric. The anti-reflective coating layer and etch stop layer may include SiN and/or SiON. The interlayer dielectric is preferably HDP, TEOS or BPTEOS. The semiconductor device also has feature(s) under the etch stop layer. For example, the semiconductor might have gate stacks and junctions such as source and drain junctions beneath the etch stop layer. Moreover, features such as the source and/or drain junctions may have a salicide layer, such as CoSi, in order to reduce their contact resistance. The resist mask preferably lies on top of the anti-reflective coating layer. The resist mask is patterned with apertures that lie above the regions of the semiconductor device where the contacts are to be located.

The anti-reflective coating layer and interlayer dielectric exposed by the apertures in the resist mask are removed in an etch step, via step 102. The etching performed in step 102 does not etch through the etch stop layer under the interlayer dielectric. In a preferred embodiment, the chemistry used for the etch in step 102 includes $C_4F_8$, $C_4F_6$, $C_5F_8$, $C_2F_6$ which etch the dielectric material and have a high selectivity to stop on the underlying nitride film (etch-stop layer).

The resist mask is removed in situ, via step 104. Because the resist mask is removed in situ, the resist mask is removed in a controlled environment, preferably in a vacuum chamber under low pressure and controlled gases introduced into the chamber. Thus, the resist mask is removed in the same chamber as the etch is performed without opening the chamber. Instead, the etch chemistry is simply changed to an $O_2$ based process. Thus, one chamber is used for multiple etch processes by changing the chemistry to allow various films to be etched. The etch chemistry used in step 104 is preferably $O_2$ based. In some embodiments, a small amount of forming gas such as $N_2/H_2$, or $H_2$, $N_2$ may be added. The range of pressures used generally varies depending upon the equipment used. For example, the pressure could vary from 30 mT to a range between 1–10 T.

The anti-reflective coating layer and the portion of the etch stop layer at the base of the contact holes are removed in situ, via step 106. Thus, the contact holes are formed, and the feature(s) to which contact is to be made are exposed. In one embodiment, a CoSi layer on a source and/or drain junction is exposed in step 106. Because the anti-reflective coating layer and etch stop layer are removed in situ, the anti-reflective coating layer and etch stop layer are removed in a controlled environment, preferably in a vacuum chamber under low pressure and controlled gases introduced into the chamber. Also in a preferred embodiment, the anti-reflective coating and etch stop layer are removed in the same chamber as the resist is removed in step 104. Thus, the same chamber is used without removing the semiconductor devices from the chamber. Instead, the etch chemistry is changed. Both the anti-reflective coating and etch stop layers are preferably a nitride type of material. For example, the anti-reflective coating and etch stop layer might be either $Si_3N_4$, SiON or the combination. The anti-reflective coating layer might also be SiRN (Si rich nitride). Thus, the etch chemistry preferably includes $CHF_3$, $CF_4$, $CH_2F_2$, or $CH_3F$. The pressure ranges vary, for example from 20 mT to 500 mT, depending on the equipment used.

The contact holes are filled with a conductive material, such as W, via step 108. As a result, electrical contact can be made to the features of the semiconductor device. In addition, a CMP step may be performed to polish the W plug, via step 110. The CMP process should be controlled to avoid and/or reduce the introduction of scratches into the interlay dielectric.

Because the removal of the resist mask and etching of the anti-reflective coating and etch stop layers are carried out in situ, fabrication of the contacts is simplified. A conventional resist ashing typically used to remove the resist mask can be avoided. In addition, the process of removing the resist mask in situ is cleaner and may obviate the need to perform a wet cleaning. Thus, defects introduced in formation of the contact hole can be reduced or avoided. In addition, because the anti-reflective coating layer is removed in situ, the CMP used to planarize the material filling the contact holes is simplified. Because the anti-reflective coating layer is removed, scratching of the anti-reflective coating layer during the CMP is not an issue.

Figure 2:
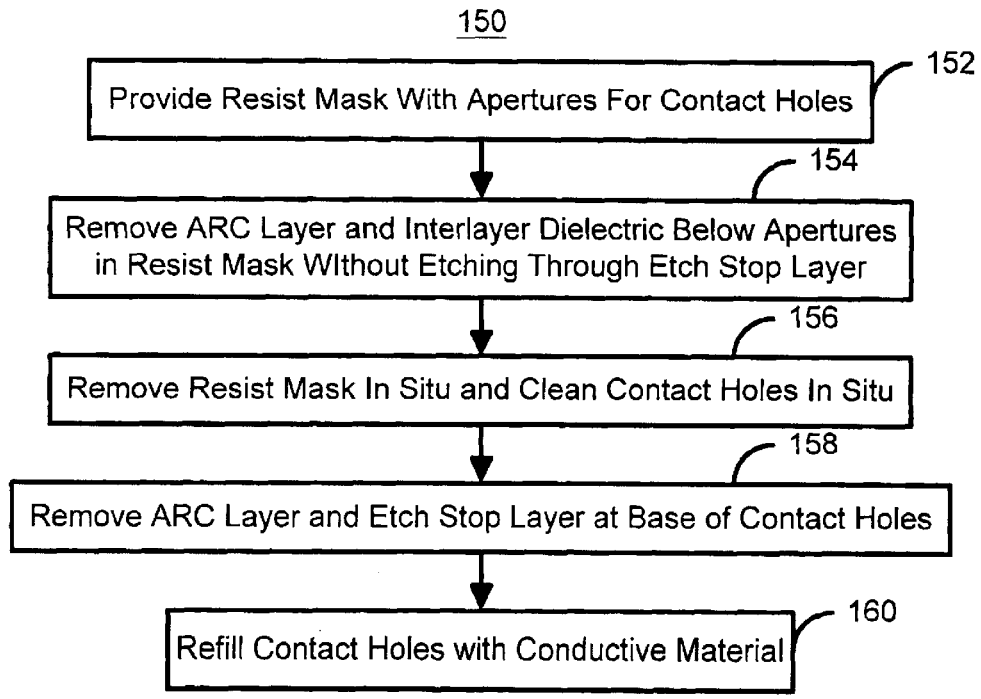
FIG. 2 is a more detailed flow chart of one embodiment of a method in accordance with the present invention for providing contact with reduced defects.

FIG. 2 is a more detailed flow chart of one embodiment of a method 150 in accordance with the present invention for providing contact with reduced defects. FIGS. 3A–3D depict one embodiment of a semiconductor device 200 in accordance with the present invention during fabrication using the method 150. The method 150 preferably commences after an etch stop layer, an interlayer dielectric layer on the etch stop layer and an antireflective coating layer on the interlayer dielectric have been provided. The anti-reflective coating layer and etch stop layer may include SiN and/or SiON. The interlayer dielectric is preferably HDP, TEOS or BPTEOS. The semiconductor device also has feature(s) under the etch stop layer. For example, the semiconductor might have gate stacks and junctions such as source and drain junctions beneath the etch stop layer. Moreover, features such as the source and/or drain junctions may have a salicide layer, such as CoSi, in order to reduce their contact resistance.

Figure 3A:
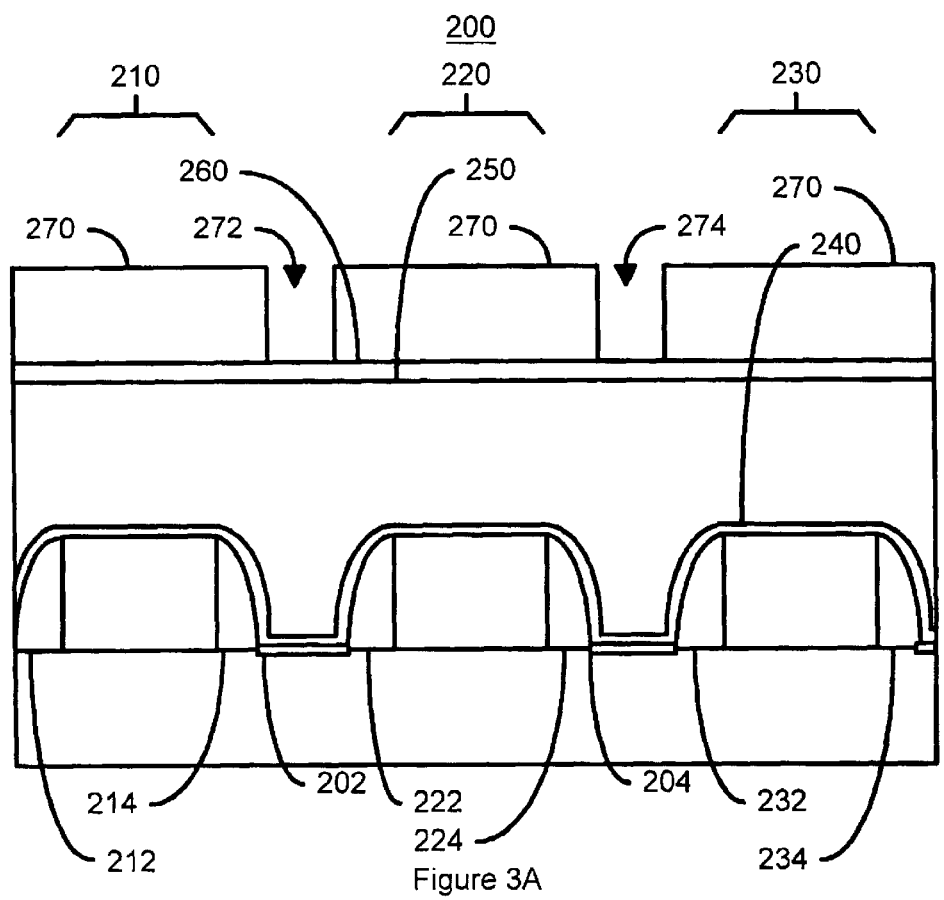

A resist mask having apertures over the regions in which the contact holes are to be formed is provided, via step 152. The resist mask preferably lies on top of the anti-reflective coating layer. FIG. 3A depicts the semiconductor device 200 including gate stacks 210, 220 and 230 formed on a substrate 201. Spacers 212 and 214, 222 and 224, and 232 and 234 are at the edges of the gate stacks 210, 220 and 230, respectively. CoSi layers 202 and 204 have been formed between the gate stacks 210 and 220 and gate stacks 220 and 230 on junctions (not explicitly shown). An etch stop layer 240 is formed on the gate stacks 210, 220 and 230 and on the CoSi layers 202 and 204. The semiconductor device 200 also includes an interlayer dielectric 250 and an anti-reflective coating layer 260. A resist mask 270 having apertures 272 and 274 is also shown. The apertures 272 and 274 are above the CoSi layers 202 and 204. Thus, in the semiconductor device 200, contact is to be made to the features below the CoSi layers 202 and 204.

Figure 3B:
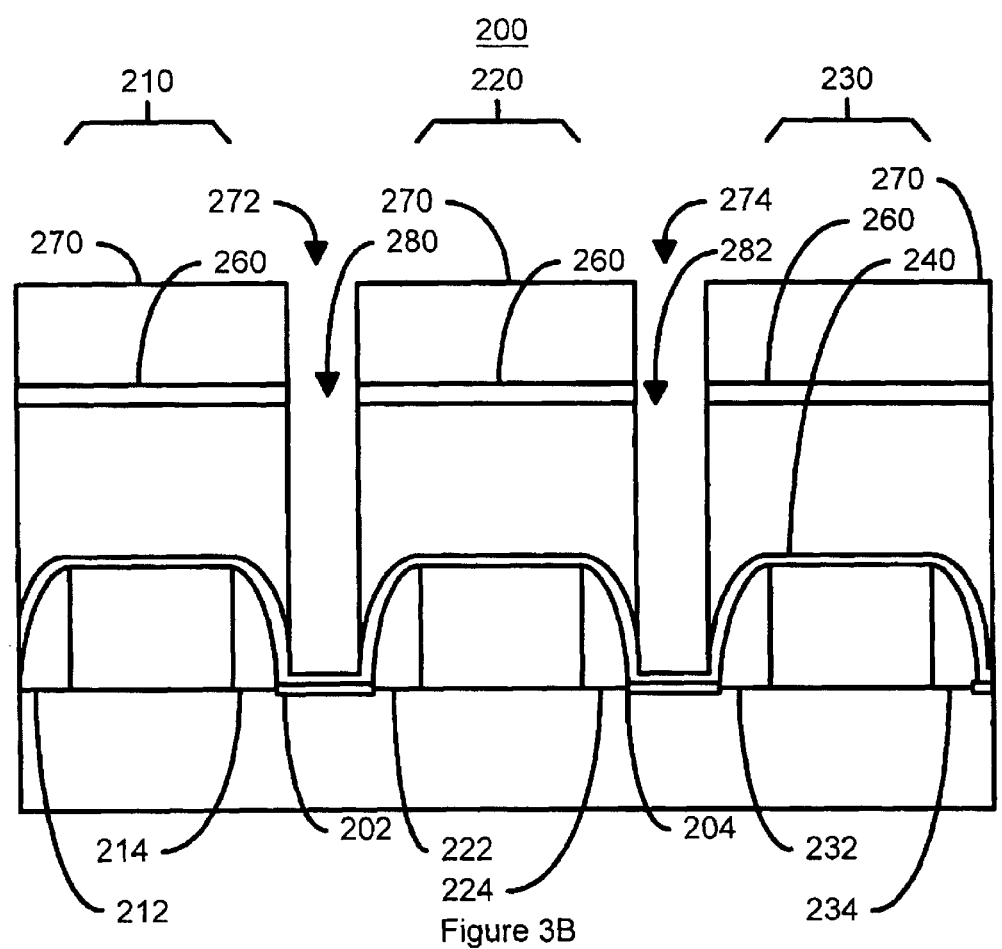

The anti-reflective coating layer 260 and interlayer dielectric 250 exposed by the apertures 272 and 274 in the resist mask 270 are removed in an etch step, via step 154. The etching performed in step 154 does not etch through the etch stop layer 240 under the interlayer dielectric 250. FIG. 3B depicts the semiconductor device 200 after step 152 is performed. A portion of contact holes 280 and 282 has been formed beneath the apertures 272 and 274. However, at least a portion of the etch stop layer 240 remains at the base of the contact holes 280 and 282.

Figure 3C:
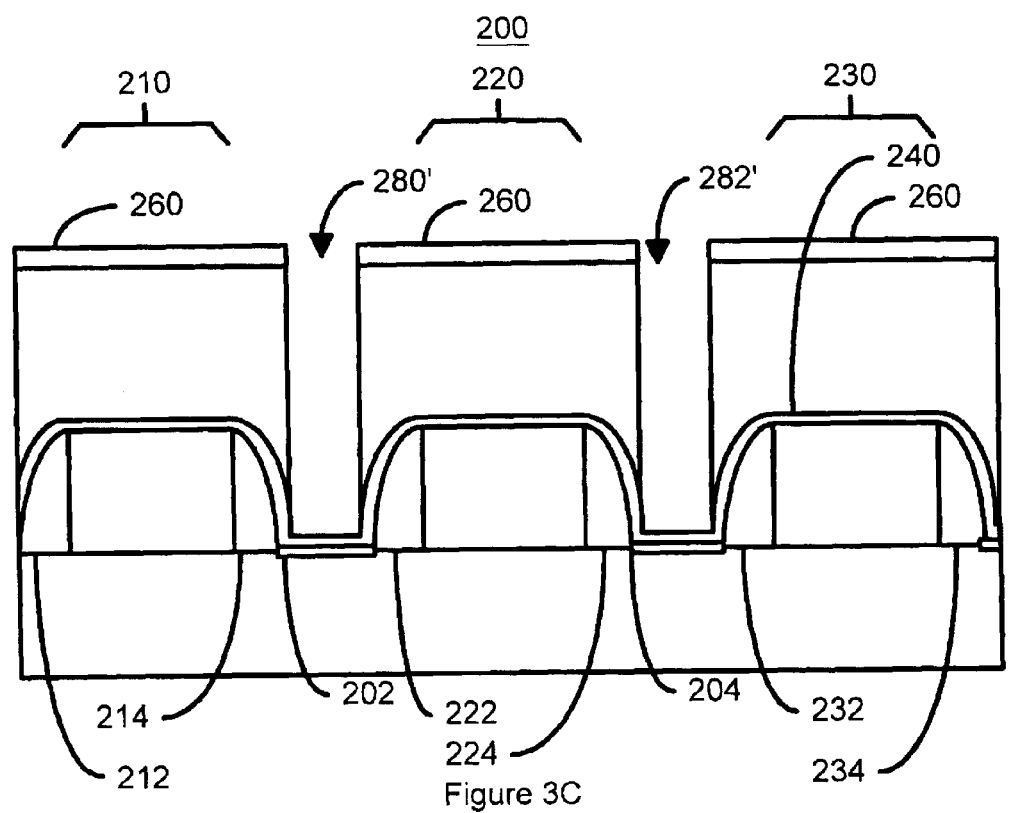

The resist mask 270 is removed and the contact holes 280 and 282 cleaned in situ, via step 156. Because the resist mask 270 is removed in situ, the resist mask 270 is removed in a controlled environment, preferably in a vacuum chamber under low pressure and controlled gases introduced into the chamber. FIG. 3C depicts the semiconductor device 200 after removal of the resist mask 270. Because the resist mask 270 is removed and the contact holes 280 and 282 are cleaned in situ, any polymers in the contact holes 280' and 282' have been substantially eliminated. Thus, the surfaces of the contact holes 280' and 282' are substantially clean.

The anti-reflective coating layer 260 and the portion of the etch stop layer 240 at the base of the contact holes 280 and 282 are removed in situ, via step 158. FIG. 3D depicts the semiconductor device 200 after removal of the etch stop layer 240 at the base of the contact holes 280" and 282". Thus, the contact holes 280" and 282" have been formed, and the CoSi layers 204 and 206 to which contact is to be made are exposed. Because the anti-reflective coating layer 260 and the portion of the etch stop layer 240 are removed in situ, the anti-reflective coating layer 260 and the portion of the etch stop layer 240 are removed in a controlled environment, preferably in a vacuum chamber under low pressure and controlled gases introduced into the chamber. The contact holes 280" and 282" are filled with a conductive material and the contact material planarized, via step 160. As a result, electrical contact can be made to the features of the semiconductor device 200. FIG. 3E depicts the semiconductor device 200 after formation of the contacts 290 and 292 are completed by filling the contact holes 280" and 282" and removing the excess conductive material, for example in a CMP step.

Because the removal of the resist mask 270 and etching of the anti-reflective coating and etch stop layers 240 and 260 are carried out in situ, fabrication of the contacts is simplified. A conventional resist ashing typically used to remove the resist mask 270 can be avoided. In addition, the process of removing the resist mask 270 in situ is cleaner and may obviate the need to perform a wet cleaning. Thus, defects introduced in formation of the contact holes 280" and 282" can be reduced or avoided. In addition, because the anti-reflective coating layer 260 is removed in situ, the CMP used to planarize the material filling the contact holes 280" and to 282" is simplified. Because the anti-reflective coating layer 260 is removed, scratching of the anti-reflective coating layer 260 during the CMP is prevented.

A method and system has been disclosed for providing contacts in a semiconductor device. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing at least one contact in a semiconductor including a substrate, an etch stop layer, an interlayer dielectric in contact with the etch stop layer, an anti-reflective coating layer in contact with the interlayer dielectric, and at least one feature below the etch stop layer, a resist mask having at least one aperture therein residing on the anti-reflective coating layer, the least one aperture being above an exposed portion of the anti-reflective coating layer, the method comprising the steps of:
   (a) etching the exposed portion of the anti-reflective coating layer and the interlayer dielectric below the exposed portion of the anti-reflective coating layer without etching through the etch stop layer to provide a portion of at least one contact hole;
   (b) removing the resist mask in situ;
   (c) removing a portion of the etch stop layer exposed in the portion of the at least one contact hole to provide the at least one contact hole in situ; and
   (d) filling the at least one contact hole with a conductive material.

2. The method of claim 1 wherein the resist mask removing step (b) further includes the step of:
   (b1) cleaning the portion of the contact hole in situ.

3. The method of claim 1 wherein the etch stop layer includes SiN and/or SiON.

4. The method of claim 1 wherein the anti-reflective coating layer includes SiN and/or SiON or SIRN (Si rich nitride).

5. The method of claim 1 further comprising the step of:
   (e) planarizing the conductive material without scratching a surface of the interlayer dielectric.

6. The method of claim 1 further comprising the step of:
   (e) removing a portion of the anti-reflective coating layer in situ before the at least one contact hole is filled.

* * * * *